United States Patent [19]
Kammerdiner et al.

[11] Patent Number: 5,142,437
[45] Date of Patent: Aug. 25, 1992

[54] CONDUCTING ELECTRODE LAYERS FOR FERROELECTRIC CAPACITORS IN INTEGRATED CIRCUITS AND METHOD

[75] Inventors: Lee Kammerdiner, Avondale; Maria Huffman; Manoochehr Golabi-Khoozani, both of Colorado Springs, all of Colo.

[73] Assignee: Ramtron Corporation, Colorado Springs, Colo.

[21] Appl. No.: 714,682

[22] Filed: Jun. 13, 1991

[51] Int. Cl.$^5$ .................. H01G 4/06; H01G 4/10; H01G 7/00
[52] U.S. Cl. .................. 361/313; 361/321; 29/25.42
[58] Field of Search .............. 361/311, 312, 313, 320, 361/321; 29/25.42

[56] References Cited

U.S. PATENT DOCUMENTS

| | | | |
|---|---|---|---|
| 3,184,660 | 5/1965 | Robinson | 361/313 |
| 3,569,802 | 3/1971 | Braver et al. | 357/10 |
| 3,579,063 | 5/1971 | Wasa et al. | 361/313 |
| 3,819,990 | 6/1974 | Hayashi et al. | 361/313 |
| 4,149,301 | 4/1979 | Cook | 29/25.42 |
| 4,149,302 | 4/1979 | Cook | 29/29.42 |
| 4,636,908 | 1/1987 | Yoshihara et al. | 361/321 |
| 4,707,897 | 11/1987 | Rohrer et al. | 29/25.42 |
| 4,809,225 | 2/1989 | Dimmler et al. | 365/145 |
| 4,853,893 | 8/1989 | Eaton, Jr. et al. | 365/145 |
| 4,873,664 | 10/1989 | Eaton, Jr. et al. | 365/145 |
| 4,888,733 | 12/1989 | Mobley | 365/145 |
| 4,893,272 | 1/1990 | Eaton, Jr. et al. | 365/145 |
| 4,910,708 | 3/1990 | Eaton, Jr. et al. | 365/145 |
| 4,914,627 | 4/1990 | Eaton, Jr. et al. | 365/145 |
| 4,918,654 | 4/1990 | Eaton, Jr. et al. | 365/145 |
| 5,003,428 | 3/1991 | Shepherd | 361/321 |
| 5,005,102 | 4/1991 | Larson | 361/313 |
| 5,024,964 | 6/1991 | Rohrer et al. | 437/47 |

OTHER PUBLICATIONS

S. F. Vogel and I. C. Barlow, *Sputtered Platinum as Substrate for Ferroelectric Film Deposition*, J. Vac. Sci. Technol., vol. 10, No. 5, Sep./Oct. 1973.

Patent Interference No. 100,842, Rohrer et al. v. Cook.

Primary Examiner—Donald Griffin
Attorney, Agent, or Firm—Edward D. Manzo; Mark J. Murphy

[57] ABSTRACT

A ferroelectric capacitor for an integrated circuit includes a stack formed by a layer of a noble metal, a layer of a conducting oxide, a layer of a ferroelectric material, another layer of a conducting oxide and another layer of a noble metal. The capacitor can also have another layer of conducting oxide located over the top layer of noble metal and below the first layer of the noble metal. A method of forming the same through establishing one layer over the other and annealing each layer is also disclosed.

38 Claims, 1 Drawing Sheet

CONDUCTING ELECTRODE LAYERS FOR FERROELECTRIC CAPACITORS IN INTEGRATED CIRCUITS AND METHOD

FIELD OF THE INVENTION

The present invention relates to integrated circuit capacitors and especially to the formation of conductive oxide layers in ferroelectric capacitors.

BACKGROUND OF THE INVENTION

Ferroelectric capacitors are of interest today because of their use in ferroelectric memories and thin film discrete capacitors. See U.S. Pat. Nos. 4,873,664; 4,809,225; 4,853,893; 4,918,654; 4,910,708; 4,914,627; 4,893,272; 4,888,733, all issued to Ramtron Corporation of Colorado Springs, Colorado, USA.

Platinum (Pt) electrodes are often used in the fabrication of ferroelectric capacitors. Unfortunately, currently a number of problems exist with the use of these Pt electrodes in ferroelectric capacitors. One advance in dealing with this problem is disclosed in EPO publication 404,295 (A1) which is based on U.S. Ser. No. 368,668, now U.S. Pat. No. 5,005,102 ("Multilayer Electrodes For Integrated Circuit Capacitors").

Ferroelectric capacitors are fabricated using an oxide known as "PZT" which refers generally to a mixture or solution, comprised of oxides of lead, zirconium and titanium, forming a perovskite structure. The PZT is sandwiched between electrodes typically comprised of noble metals, terminal lower and upper electrodes. The lower electrode is deposited directly on silicon dioxide or some other suitable dielectric. When using Pt (or another noble metal) in the fabrication of a ferroelectric capacitor the adhesion at the interface between the Pt or other noble metals and the dielectric is poor. If there is poor adhesion at this interface, delamination can potentially occur between the electrode and the dielectric.

Presently, one approach for solving this adhesion problem is to use titanium (Ti) or chromium (Cr) under the Pt as a "glue" layer. However, both Ti and Cr can readily diffuse through the Pt. If the Ti or Cr does diffuse through the Pt and is able to reach the PZT interface, the Ti or Cr will oxidize and will result in the degradation of the electrical properties of the capacitor.

When using conventional physical deposition techniques, Pt typically tends to orient with the (111) crystal planes of Pt parallel to most substrates. Unfortunately, when using these techniques, the orientation of Pt cannot be changed or controlled. Therefore, one is limited to an orientation parallel to the substrate.

In addition to Pt, other materials have been suggested for use as electrodes in fabricating ferroelectric capacitors. For example, indium tin oxide (ITO) is commonly mentioned as a possible electrode in the literature. However, the conductivity of ITO is too low for use in integrated circuits. Further, the possibility of epitaxy with ITO is not mentioned in the literature. Aluminum is another metal which has been used as the top electrode in a ferroelectric capacitor. See Ramtron's EPO 404,295 (A1), supra. Unfortunately, aluminum oxide can form at the PZT to aluminum interface and cause a significant degradation of the electrical properties of thin (less than one micron) films.

Accordingly, the object of the present invention is to create a ferroelectric capacitor structure that overcomes the deficiencies of the prior devices.

SUMMARY OF THE INVENTION

The present invention in one of its aspects is directed to using layers of conducting oxides with layers of a noble metal to solve the adhesion problem at all the oxide interfaces in a ferroelectric capacitor.

In a first embodiment of the present invention, the first layer of the ferroelectric capacitor comprises a layer of a noble metal. A layer of a conducting oxide is located over the layer of the noble metal. A ferroelectric material is located (as capacitor dielectric) over the layer of the conducting oxide. Another layer of the conducting oxide and of the noble metal would then be located over the ferroelectric material.

In a second embodiment, the first layer of the ferroelectric capacitor comprises a layer of a conducting oxide. This first layer can be established on a layer of grown $SiO_2$. A layer comprising a noble metal is located over the layer of conducting oxide. Between the interface of the noble metal and the conducting oxide, there will be some intermixing. However, another layer of the conducting oxide is located over the noble metal to provide a "glue" layer. The "glue" layer will allow only a minimal amount of intermixing to extend through to the ferroelectric layer. Intermixing at the interface of the ferroelectric layer is undesirable since this intermixing can cause a degradation of the ferroelectric. The ferroelectric layer is located over the conducting oxide layer. The layer of conducting oxide provides a good interface mechanically and electrically to the ferroelectric material. Having a layer of a noble metal between the two conducting oxide layers provides the necessary conductivity for this capacitor since these layers will be used as interconnects. On top of the ferroelectric, a similar structure with a layer of conducting oxide, a layer of noble metal, and another layer of conducting oxide is preferably located.

The present invention is further directed to a method for forming a ferroelectric capacitor. In general, the method comprises a number of steps wherein a layer of one of the materials of the present invention is established on another layer and the established layer is annealed.

BRIEF DESCRIPTION OF THE DRAWINGS

In describing the preferred embodiment, reference is made to the accompanying drawings wherein like parts have like reference numerals, and wherein.

DETAILED DESCRIPTION OF THE PREFERRED EMBODIMENTS

Figure 1:
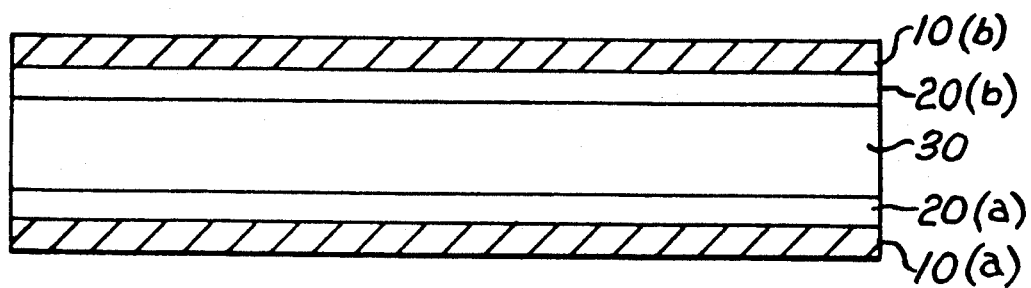
FIG. 1 is a cross-sectional drawing of a first embodiment of the ferroelectric capacitor of the present invention.

FIG. 1 illustrates the use of conducting oxide layers in a ferroelectric capacitor structure according to a first embodiment of the present invention. A layer of a noble metal 10(a) comprises the first layer of the structure. Either platinum (Pt), palladium (Pd), or gold (Au) could be used as the noble metal in this layer. In the preferred embodiment, the noble metal is Pt. A layer of a conducting oxide 20(a) is then established over noble metal layer 10(a). This layer can be established by, for example, deposition. The conducting oxide could be indium tin oxide (ITO), ruthenium oxide, rhenium oxide, or some of the conducting perovskites but preferably is ITO. A layer of ferroelectric material 30, such as lead zirconate titanate (PZT), for example, is established over conducting oxide layer 20(a) and serves as the dielectric of the capacitor. In addition, any variation of PZT produced with a dopant, such as lanthanum (La), tin (Sn), or niobium (Nb), for example, could be used as the dielectric. Another layer 20(b) of a conducting oxide and a layer 10(b) of a noble metal over a conducting oxide layer 20(b) are then established over ferroelectric layer 30.

Figure 2:
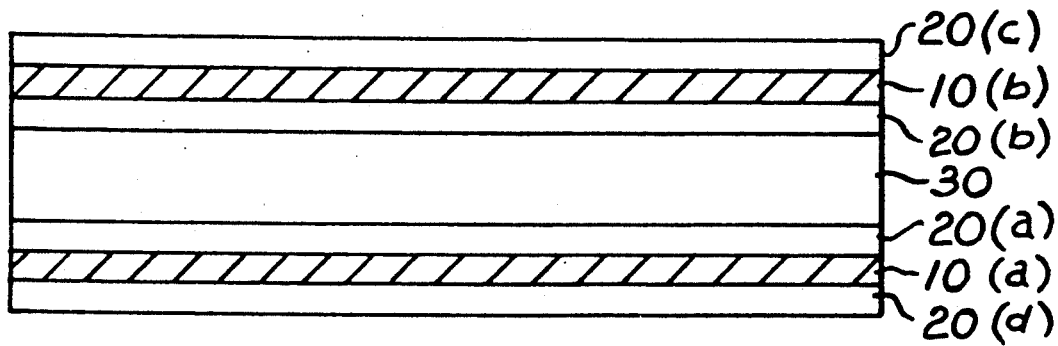
FIG. 2 is a cross-sectional drawing of a second embodiment of the ferroelectric capacitor of the present invention.

FIG. 2 illustrates a second embodiment of the present invention. In this structure, an additional layer 20(c) of a conducting oxide is established over (and on top of) the second layer 10(b) of a noble metal. Further, a layer 20(d) of a conducting oxide is located below the first layer 10(a) of the noble metal.

By having layers 20(a,b) of the conducting oxide next to ferroelectric layer 30, the conducting oxide will act as the glue layer. Furthermore, because these oxides are conducting, they will not degrade the electrical properties of the capacitor as would be the case with insulating oxides. In addition, it will be less likely for these oxides to diffuse through the Pt or another noble metal. It is important that the conducting oxides be stacked with a layer of another conductor since by themselves they are not good enough conductors. However, through the use of layer 10(a,b) of Pt, which is a good conductor, the problem is solved.

Each layer 20(a,b,c,d) of conducting oxide preferably has a thickness in the range of 200Å to 2,000Å. The layer of conducting oxide should be thick enough s that it is a continuous film. However, it cannot be too thick, or integrity problems will occur. The thickness of each layer 10(a,b) of the noble metal preferably is in the range of 500Å to 3,000Å. The ferroelectric layer 30 preferably has a thickness of 500Å to 10,000Å. The specific thickness of the ferroelectric layer will depend on the coercive voltage desired. In addition, for all layers, it is desired that the thickness be kept as thin as possible in order to minimize the size of the ferroelectric capacitor.

An additional advantage to using a conducting oxide, such as ITO, is that when ITO is used immediately below PZT, the lattice structure of the ITO matches very well with the lattice structures of the PZT and the Pt. Accordingly, epitaxial growth can occur. Table 1 shows a comparison of d spacings of Pt, ITO, and PZT. (hkl) refers to the Miller indices for the crystal planes. For example, (111) is h=1, k=1, l=1.

TABLE 1

| Pt | | ITO | | $Pb(Zr_{.48}Ti_{.52})O_3$ | |
|---|---|---|---|---|---|
| (hkl) | d | (hkl) | d | (hkl) | d |
| | | (211) | 4.13 | (001) | 4.146 |
| | | | | (100) | 4.036 |
| | | (222) | 2.92 | (101) | 2.890 |
| | | | | (110) | 2.850 |
| (111) | 2.265 | (411) | 2.385 | (111) | 2.351 |

As discussed previously, Pt typically tends to orient so that the (111) crystal plane of the Pt is parallel to most substrates. For example, the (111) plane of Pt would tend to orient parallel to the (100) Si plane of the substrate when either grown or deposited silicon oxides are used as the substrate for electrode layers. However, by the use of an appropriate deposition process, one can orient the (411) plane of the ITO layer with the (111) plane of the Pt layer and then orient the (111) plane of the PZT dielectric on the (411) plane of the ITO layer. This should improve the short and long term electrical properties of the capacitor structure.

The preferred method of forming a ferroelectric capacitor according to the present invention is accomplished through a series of establishing and annealing steps. The layers of the present invention can be established by deposition, for example. The preferred deposition process is by ion cluster beam (ICB) for all the layers. Through the use of ion cluster beam, film growth can be controlled which will improve density and also provide orientation control. This provides the ferroelectric capacitor with superior electrical properties including both initial switching and longer term reliability. Other methods of deposition including sputtering, evaporation, molecular beam epitaxy, and ion plating ma be used for some or all of the layers. Molecular beam epitaxy or ion plating are preferred over sputtering and evaporation since it is possible to have epitaxy with molecular beam epitaxy or ion plating but not with sputtering or evaporation. It is preferred that the deposition be done in situ. However, it is also possible to deposit the layers in separate pumpdowns if the proper cleaning procedures are used.

A typical in situ deposition process for the first embodiment, using ICB, has an acceleration potential ($V_m$) in the range of about 0 to about 6.0 kV, an ionization current ($I_c$) in the range of about 0 to about 200 mA and a substrate heat in the range of about 25 to about 900° C. The preferred deposition process, for the structure of the first embodiment, is as follows:

(1) Deposit a layer 10(a) of a noble metal using an optimized acceleration potential ($V_m$), ionization current ($I_c$) and substrate heat for orientation control;

(2) Anneal the layer of the noble metal, as needed;

(3) Deposit a layer 20(a) of conducting oxide, using an optimized $V_m$, $I_c$ and substrate heat for orientation control;

(4) Anneal the layer of conducting oxide, as needed;

(5) Deposit a ferroelectric layer 30 with $V_m$, $I_c$ and substrate heat, and ozone gas ambient optimized for orientation;

(6) Anneal the ferroelectric layer, as needed;

(7) Deposit another layer 20(b) of conducting oxide with an optimized $V_m$, $I_c$ and substrate heat and annealing that layer, as needed; and (8) Deposit another layer of the noble metal with an optimized $V_m$, $I_c$ and substrate heat and annealing that layer, as needed. Preferably, this all occurs in a single pumpdown.

A typical in situ deposition process for the second embodiment of the present invention, using ICB, has an acceleration potential ($V_m$) in the range of about 0 to about 6.0 kV, an ionization current ($I_c$) in the range of about 0 to about 200 mA and a substrate heat in the range of about 25 to 900° C. The preferred deposition process, for the structure of the second embodiment, is as follows:

(1) Deposit a layer 20(d) of a conducting oxide, using optimized $V_m$, $I_c$, and substrate heat for orientation control;

(2) Anneal the layer of conducting oxide in situ, as needed;

(3) Without vacuum break, deposit a layer 10(a) of a noble metal using an optimized $V_m$, $I_c$ and substrate heat for orientation control;

(4) Anneal the layer of the noble metal, as needed;

(5) Deposit another layer 20(a) of conducting oxide, using an optimization for $V_m$, $I_c$ and substrate heat;

(6) Anneal the layer of conducting oxide, as needed;

(7) Deposit a ferroelectric layer 30 with $V_m$, $I_c$, substrate heat, and ozone gas ambient optimized for orientation;

(8) Anneal the ferroelectric layer, as needed;

(9) Deposit another layer 20(b) of conducting oxide with an optimized $V_m$ and $I_c$ and substrate heat and annealing that layer, as needed;

(10) Deposit another layer 10(b) of the noble metal with an optimized $V_m$ and $I_c$ and substrate heat and annealing that layer, as needed; and

(11) Deposit another layer 20(c) of the conducting oxide with an optimized $V_m$ and $I_c$ and substrate heat and annealing, as needed. Preferably, this all occurs in one single pumpdown.

It is preferred that all the layers be deposited in situ. This provides better control of the interfaces and minimizes the interfaces. There are some steps where it is particularly advantageous to avoid the breaking of the vacuum. For example, if the conducting oxide and the ferroelectric material can be deposited in a single step without breaking the vacuum, the interface will be minimized and contaminants eliminated. In some cases, however, it is not possible to deposit all of the layers in situ. The layers can then be deposited in several pumpdowns as long as the proper cleaning procedures are utilized.

This description has been offered for illustrative purposes only and is not intended to limit the invention of this application, which is defined in the claims below.

We claim:

1. An integrated circuit capacitor comprising:
    a first layer comprising a noble metal;
    a second layer over said first layer, said second layer comprising a conducting oxide;
    a third layer over said second layer, said third layer comprising a ferroelectric material;
    a fourth layer over said third layer, said fourth layer comprising a conducting oxide; and
    a fifth layer over said fourth layer, said fifth layer comprising a noble metal.

2. An integrated circuit capacitor according to claim 1 wherein said first and fifth layers have a thickness from about 500Å to about 3000Å.

3. An integrated circuit capacitor according to claim 1 wherein second and fourth layers have a thickness from about 200Å to about 2000Å.

4. An integrated circuit capacitor according to claim 1 wherein said third layer has a thickness from about 500Å to about 10,000Å.

5. An integrated circuit capacitor according to claim 1 wherein said noble metal comprises an element from the group consisting of platinum, palladium, and gold.

6. An integrated circuit capacitor according to claim 1 wherein said noble metal comprises platinum.

7. A ferroelectric capacitor according to claim 1 wherein said ferroelectric material is lead zirconate titanate.

8. An integrated circuit capacitor according to claim 7 wherein said lead zirconate titanate comprises a dopant from the group consisting of lanthanum, tin, and niobium.

9. The integrated circuit capacitor according to claim 1 wherein said first layer is directly in contact with said second layer, said second layer is directly in contact with said third layer, said third layer is directly in contact with said fourth layer, and said fourth layer is directly in contact with said fifth layer.

10. A ferroelectric capacitor comprising:
    a first layer comprising a noble metal;
    a second layer over said first layer, said second layer comprising a conducting oxide;
    a third layer over said second layer, said third layer comprising a ferroelectric material;
    a fourth layer over said third layer, said fourth layer comprising a conducting oxide; and
    a fifth layer over said fourth layer, said fifth layer comprising a noble metal,
    wherein said conducting oxide comprises an oxide from the group comprising indium tin oxide, ruthenium oxide, and rhenium oxide.

11. The ferroelectric capacitor according to claim 10 wherein said first layer is directly in contact with said second layer, said second layer is directly in contact with said third layer, said third layer is directly in contact with said fourth layer, and said fourth layer is directly in contact with said fifth layer.

12. A ferroelectric capacitor comprising:
    a first layer comprising a noble metal;
    a second layer over said first layer, said second layer comprising a conducting oxide;
    a third layer over said second layer, said third layer comprising a ferroelectric material;
    a fourth layer over said third layer, said fourth layer comprising a conducting oxide; and
    a fifth layer over said fourth layer, said fifth layer comprising a noble metal,
    wherein said conducting oxides comprise a conducting pervoskite oxide.

13. The ferroelectric capacitor according to claim 12 wherein said first layer is directly in contact with said second layer, said second layer is directly in contact with said third layer, said third layer is directly in contact with said fourth layer, and said fourth layer is directly in contact with said fifth layer.

14. A ferroelectric capacitor comprising:
    a first layer, comprising a conducting oxide;
    a second layer over said first layer, said second layer comprising a noble metal;
    a third layer over said second layer, said third layer comprising a conducting oxide;
    a fourth layer over said third layer, said fourth layer comprising a ferroelectric material;
    a fifth layer over said fourth layer, said fifth layer comprising a conducting oxide;
    a sixth layer over said fifth layer, said sixth layer comprising a noble metal; and
    a seventh layer over said sixth layer, said seventh layer comprising a conducting oxide.

15. A ferroelectric capacitor according to claim 14 wherein said first layer is grown on a $SiO_2$ layer.

16. A ferroelectric capacitor according to claim 14 wherein said first, third, fifth, and seventh layers have a thickness from about 200Å to about 2000Å.

17. A ferroelectric capacitor according to claim 14 wherein said second and sixth layers have a thickness from about 500Å to about 3000Å.

18. A ferroelectric capacitor according to claim 14 wherein said fourth layer has a thickness from about 500Å to about 10,000Å.

19. A ferroelectric capacitor according to claim 14 wherein said noble metal comprises an element from the group consisting of platinum, palladium, and gold.

20. A ferroelectric capacitor according to claim 14 wherein said noble metal comprises platinum.

21. A ferroelectric capacitor according to claim 14 wherein said ferroelectric material is lead zironcate titanate.

22. A ferroelectric capacitor according to claim 21 wherein said lead zirconate titanate comprises a dopant from the group consisting of lanthanum, tin, and niobium.

23. A ferroelectric capacitor according to claim 14 wherein said conducting oxide comprises an oxide from the group consisting of indium tin oxide, ruthenium oxide, and rhenium oxide.

24. A ferroelectric capacitor according to claim 14 wherein said conducting oxide comprises a conducting perovskite oxide.

25. The ferroelectric capacitor according to claim 14 wherein said layers are in contact with each other.

26. The ferroelectric capacitor according to claim 14 wherein said first layer is directly in contact with said second layer, said second layer is directly in contact with said third layer, said third layer is directly in contact with said fourth layer, said fourth layer is directly in contact with said fifth layer, said fifth layer is directly in contact with said sixth layer, and said sixth layer is directly in contact with said seventh layer.

27. A method for forming a ferroelectric capacitor comprising the steps of:
    establishing a first layer, said first layer comprising a noble metal;
    annealing said noble metal;
    establishing a second layer, comprising a conducting oxide, over said first layer;
    annealing said conducting oxide;
    establishing a third layer, comprising a ferroelectric material, over said second layer;
    annealing said third layer;
    establishing a fourth layer, comprising a conducting oxide, over said third layer;
    annealing said conducting oxide;
    establishing a fifth layer, comprising a noble metal, over said fourth layer; and
    annealing said noble metal.

28. The method of claim 27 wherein said layers are established by deposition.

29. The method of claim 28 wherein said layers are deposited in situ.

30. The method of claim 28 wherein said layers are deposited by ion cluster beam.

31. The method of claim 28 wherein said layers are deposited with an acceleration potential in the range of about 0 to about 6.0 kV, an ionization current in the range of about 0 to about 200 mA and a substrate heat in the range of about 25 to about 900° C.

32. The method according to claim 27 wherein said first layer is directly in contact with said second layer, said second layer is directly in contact with said third layer, said third layer is directly in contact with said fourth layer, and said fourth layer is directly in contact with said fifth layer.

33. A method for forming a ferroelectric capacitor comprising the steps of:
    establishing a first layer, comprising a conducting oxide;
    annealing said conducting oxide;
    establishing a second layer, comprising a noble metal, over said first layer;
    annealing said noble metal;
    establishing a third layer, comprising a conducting oxide, over said second layer;
    annealing said third layer;
    establishing a fourth layer, comprising a ferroelectric material, over said third layer;
    annealing said ferroelectric material;
    establishing a fifth layer, comprising a conducting oxide, over said fourth layer;
    annealing said conducting oxide;
    establishing a sixth layer, comprising a noble metal, over said fifth layer;
    annealing said sixth layer;
    establishing a seventh layer, comprising a conducting oxide, over said sixth layer; and
    annealing said conducting oxide.

34. The method of claim 33 wherein said layers are established by deposition.

35. The method of claim 34 wherein said layers are deposited in situ.

36. The method of claim 34 wherein said layers are deposited by ion cluster beam.

37. The method of claim 34 wherein said layers are deposited with an acceleration potential in the range of about 0 to about 6.0 kV, an ionization current in the range of about 0 to about 200 mA and a substrate heat in the range of about 25 to about 900° C.

38. The method according to claim 33 wherein said first layer is directly in contact with said second layer, said second layer is directly in contact with said third layer, said third layer is directly in contact with said fourth layer, said fourth layer is directly in contact with said fifth layer, said fifth layer is directly in contact with said sixth layer, and said sixth layer is directly in contact with said seventh layer.

* * * * *